United States Patent
Liu et al.

(10) Patent No.: US 9,935,052 B1
(45) Date of Patent: Apr. 3, 2018

(54) POWER LINE LAYOUT IN INTEGRATED CIRCUITS

(71) Applicant: Altera Corporation, San Jose, CA (US)

(72) Inventors: Hui Liu, Dublin, CA (US); Karthik Chandrasekar, Fremont, CA (US); Kyung Suk Oh, Cupertino, CA (US); Kaushik Chanda, San Jose, CA (US); Arifur Rahman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 387 days.

(21) Appl. No.: 14/554,667

(22) Filed: Nov. 26, 2014

(51) Int. Cl.
| H05K 1/11 | (2006.01) |
| H05K 1/14 | (2006.01) |
| H01L 23/528 | (2006.01) |
| H01L 23/00 | (2006.01) |
| H01L 23/48 | (2006.01) |

(52) U.S. Cl.
CPC ........ *H01L 23/5286* (2013.01); *H01L 23/481* (2013.01); *H01L 24/14* (2013.01); *H01L 2224/1403* (2013.01)

(58) Field of Classification Search
CPC ........ H01L 23/49822–23/49827; H01L 23/50; H01F 19/04
USPC ......... 361/782–784, 792–795, 803; 257/686, 257/728–730, 770–774
See application file for complete search history.

(56) References Cited

U.S. PATENT DOCUMENTS

| 5,885,855 | A  | * | 3/1999 | Liang | ...................... | H01L 23/50 |
| | | | | | | 257/E23.02 |
| 6,489,688 | B1 | * | 12/2002 | Baumann | ................ | H01L 23/50 |
| | | | | | | 257/691 |
| 6,961,247 | B2 | | 11/2005 | Tomsio et al. | | |
| 7,446,389 | B2 | * | 11/2008 | Cornelius | ......... | H01L 23/49822 |
| | | | | | | 257/528 |
| 7,535,728 | B2 | * | 5/2009 | Chakravorty | ..... | H01L 23/49822 |
| | | | | | | 361/761 |
| 7,902,654 | B2 | | 3/2011 | Chao-Eoan et al. | | |
| 7,902,662 | B2 | * | 3/2011 | Amey | ...................... | H01L 23/50 |
| | | | | | | 257/691 |
| 8,289,051 | B2 | * | 10/2012 | Turner | .................... | H01L 24/06 |
| | | | | | | 326/101 |
| 8,314,474 | B2 | | 11/2012 | McLellan et al. | | |
| 8,549,460 | B2 | | 10/2013 | Law et al. | | |
| 8,698,325 | B2 | * | 4/2014 | Chang | ..................... | H01L 24/05 |
| | | | | | | 257/737 |
| 8,773,866 | B2 | * | 7/2014 | Jin | ......................... | H01F 19/04 |
| | | | | | | 361/783 |
| 9,337,138 | B1 | * | 5/2016 | Abugharbieh | ...... | H01L 23/5385 |

(Continued)

*Primary Examiner* — Tuan T Dinh
(74) *Attorney, Agent, or Firm* — Tianyi He

(57) ABSTRACT

Circuitry having power lines with comparable path resistances may include input-output blocks in an integrated circuit (IC) that are coupled to respective sets of bumps on the IC. The circuitry may have a core region and a periphery region. Groups of input-output blocks may be formed in the periphery region. A first set of power lines in the circuitry extends from the core region to the first group of input-output blocks whereas a second set of power lines in the circuitry extends from the core region to the second group of input-output blocks. The first and second sets of power lines are physically separate from each other.

16 Claims, 5 Drawing Sheets

(56) References Cited

U.S. PATENT DOCUMENTS

| | | | |
|---|---|---|---|
| 2004/0085099 A1* | 5/2004 | Ratchkov | H01L 23/5286 |
| | | | 327/100 |
| 2007/0263364 A1* | 11/2007 | Kawabe | H01L 23/49822 |
| | | | 361/728 |
| 2011/0291288 A1* | 12/2011 | Wu | H01L 23/49827 |
| | | | 257/774 |
| 2013/0037933 A1 | 2/2013 | Jergovic et al. | |
| 2014/0210097 A1* | 7/2014 | Chen | H01L 21/50 |
| | | | 257/774 |

* cited by examiner

POWER LINE LAYOUT IN INTEGRATED CIRCUITS

BACKGROUND

An integrated circuit (IC) may include circuitry or logic elements that may be used to perform any of a variety of functions. An IC may be formed by multiple interconnecting metal and via layers. Signals, including power and ground signals, are routed to different parts of the IC via signal routing networks formed within the multiple metal and via layers in the IC. Various networks such as signal, clock and power networks may be formed to connect different circuitry within the IC.

Typically, an IC is packaged to protect internal circuitry from external contamination or physical damage. An IC package generally includes an IC die placed on a substrate. Interconnects such as bumps (e.g., controlled collapse chip connection bumps) on a surface of the IC die (e.g., such as a flip-chip die) may electrically connect the IC die to the substrate that it is placed on. Such an IC may be connected to other circuit elements, such as a memory module or even another IC, when used as part of a larger system.

Signals, including clock signals, may be transmitted from or received by the IC via the bumps. Power supply may generally be provided by an external source to the IC. For example, a power source (e.g., Vcc or ground voltage) may be connected to the IC via the bumps on the IC. Power lines or metal straps are formed in the various metal layers in the IC to connect circuitry within the IC to the bumps.

Generally, the power lines may be formed in at least two different metal layers and arranged in a mesh pattern with some of the power lines extending across the bumps on the IC. As the power lines extend across the bumps, the power lines may form a shared power network in the IC. This may lead to higher voltage drop for circuitry in the periphery region of the IC. For example, input-output circuitry placed at the periphery region of the IC may experience higher voltage drop as they are farther away from the core region (where the bumps are located) of the IC. Power lines that are arranged across bumps on the IC may also cause uneven current distribution between the bumps that may subsequently degrade performance of the device or reduce the life cycle of the device.

It is within this context that the embodiments described herein arise.

SUMMARY

Integrated circuits (ICs) with power lines that have comparable path resistances are provided. The power lines may distribute current evenly to bumps on the IC. Embodiments of the present invention include different configurations for such ICs. A multi-layer interposer with additional power lines formed in the metal layers within the interposer may be placed beneath the IC. The power lines formed within the interposer may form part of a power network for the IC.

It is appreciated that the present invention can be implemented in numerous ways, such as a process, an apparatus, a system, or a device. Several inventive embodiments of the present invention are described below.

Circuitry with power lines that have comparable path resistances may include input-output blocks and parallel power lines connecting the input-output blocks to respective bumps or interconnects. The circuitry may have a core region and a periphery region. Input-output blocks may be formed in the periphery region. As an example, a first set of power lines may extend from the core region to a first group of input-output blocks in the periphery region and a second set of power lines may extend from the core region to a second group of input-output blocks in the periphery region. The power lines may be formed or laid out such that the first and second sets of power lines are physically separate from each other. In one scenario, the first set of power lines forms a power network for the first group of input-output blocks whereas the second set of power lines forms another power network for the second group of input-output blocks.

Alternatively, circuitry may include an input-output block and first and second power supply paths that couple the input-output block to respective first and second bumps. The first and second power supply paths may be of different lengths (e.g., the length of the second power supply path may be greater than that of the first power supply path) and may share similar path resistance such that current is evenly distributed to the respective first and second bumps. The input-output block and the power supply paths may be formed in an IC.

In some embodiments, the circuitry may further include an interposer disposed beneath the IC. Additional power supply paths or power supply lines may be formed in the interposer. The additional power supply paths in the interposer, together with the power supply paths formed within the IC, may form a power network for the IC. The interposer may further include decoupling capacitors that may be used to restrict current flow within groups of input-output blocks in the IC. As an example, the IC may include multiple input-output blocks that are coupled to their respective sets of bumps. Power supply lines formed in the interposer may form part of an individual power network for each of the input-output blocks in the IC. Each input-output block in the IC may accordingly be coupled to its own decoupling capacitor in the interposer that restricts current flow within that input-output block.

DETAILED DESCRIPTION

The embodiments provided herein include circuitry with power lines that have comparable path resistances and integrated circuit (IC) packages that include such circuitry.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
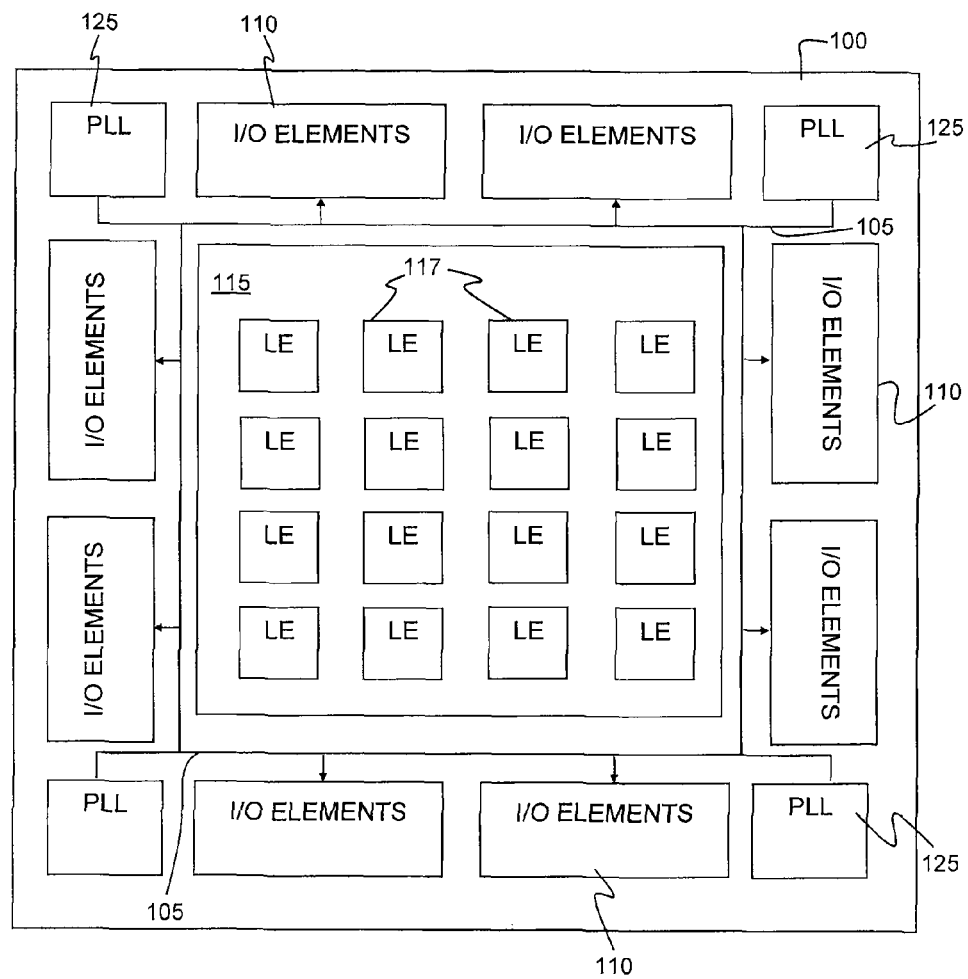
FIG. 1 is a simplified block diagram of an integrated circuit in accordance with embodiments of the present invention.

An IC device, such as a field-programmable gate array (FPGA) device or an application specific integrated circuit (ASIC) device, generally includes a core region and a peripheral region with input-output circuitry. FIG. 1, meant to be illustrative and not limiting, shows a block diagram of IC 100 that can implement embodiments of the present invention. An IC device such as IC 100 may include core logic region 115 at its center region and input-output elements 110 arranged at its peripheral region.

Core logic region 115 may be populated with logic cells that include "logic elements" (LEs) 117, among other circuits. LEs 117 may include look-up table-based logic regions and may be grouped into "Logic Array Blocks" (LABs). LEs 117 and groups of LEs or LABs can be configured to perform logical functions desired by the user. Configuration data loaded into configuration memory may be used to produce control signals that configure LEs 117 and groups of LEs and LABs to perform the desired logical functions.

As is generally known, IC devices may use a clock signal to synchronize different circuit elements in the device. Phase-locked loops (PLLs) 125 for clock generation and timing, may be located outside core logic region 115 (e.g., at corners of IC 100 and adjacent to input-output elements 110 as shown in FIG. 1). In the embodiment of FIG. 1, IC 100 may include clock network 105 that may be used to transmit clock signals from clock circuits (e.g., PLLs 125) to core logic region 115 and various parts of IC 100, including input-output elements 110.

In the embodiment of FIG. 1, input-output elements 110 may include input-output buffers and various circuits that connect IC 100 to other external components via a variety of input-output interfaces. A single device such as IC 100 may support a variety of different interfaces and each individual input-output block 110 may support a different input-output standard with a different interface or protocol (e.g., high-speed serial interface protocol). Signals received at input-output elements 110 from external circuitry or components coupled to IC 100 may be routed from input-output elements 110 to core logic region 115 or other logic blocks (not shown) on IC 100. Core logic region 115, or more specifically, logic blocks within core logic region 115, on IC 100 may perform functions based on the signals received. Signals are accordingly sent from core logic region 115 to any external circuitry or components that may be connected to IC 100 via input-output elements 110.

As mentioned, an IC is typically packaged to protect internal circuitry from external contamination or physical damage. As such, IC 100 may be a flip-chip die disposed on a package substrate. Interconnects such as controlled collapse chip connection (C4) bumps (not shown) on a surface of the IC die may electrically connect the IC die to the substrate that it is placed on. Signals may accordingly be transmitted between the IC die and any external components coupled to it via the package substrate and interconnects on the IC die.

Figure 2A:
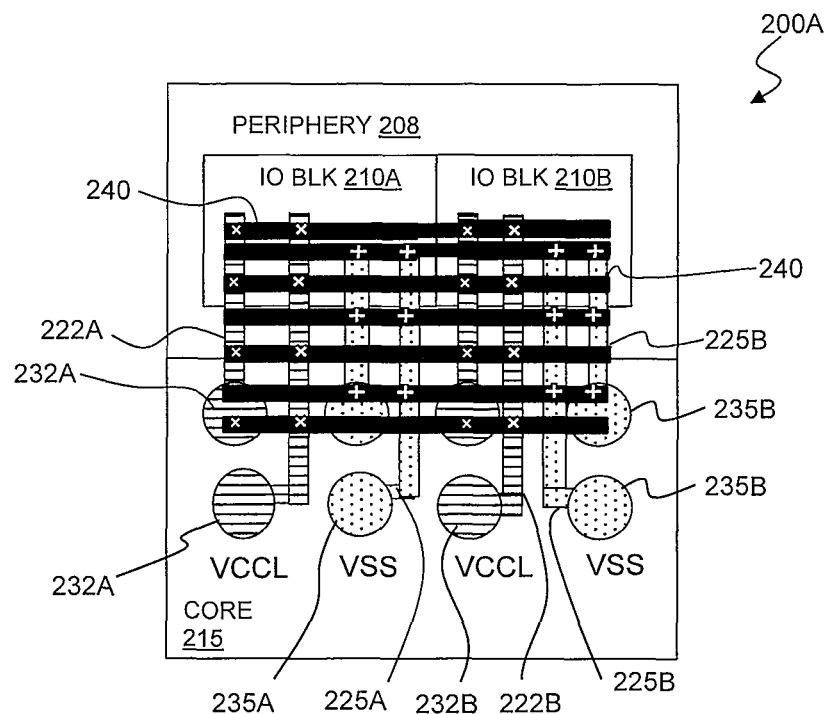
FIG. 2A shows a conventional integrated circuit die with power lines or metal straps that are formed in the various metal layers in the integrated circuit that connect a power source (or a ground voltage) to circuitry within the integrated circuit via bumps on the integrated circuit.

As is generally known, an IC die such as IC 100 may be formed with multiple metal layers. Metal traces and vias connect circuitry formed in the various metal layers. These metal traces may also connect circuitry within the IC to bumps formed on the IC. As an example, power may be supplied by an external source to the IC die and as such, a power source (e.g., Vcc or ground voltage) may be connected to the IC via the bumps on the IC. FIG. 2A shows a prior art IC die with power lines or metal straps that are formed in the various metal layers in the IC that connect a power source (or a ground voltage) to circuitry within the IC via bumps on the IC.

As shown in FIG. 2A, input-output block 210A is connected to bumps 232A via parallel power lines 222A and connected to bumps 235A via parallel power lines 225A. Bumps 232A are connected to voltage level VCCL while bumps 235A are connected to ground voltage VSS. Similarly, input-output block 210B is connected to bumps 232B via parallel power lines 222B and is connected to bumps 235B via parallel power lines 225B. Bumps 232B supply voltage level VCCL to input-output block 210B while bumps 235B supply ground voltage VSS to input-output block 210B.

As shown in FIG. 2A, bumps 232A, 235A, 232B and 235B are formed at the surface of the core or center region 215 of IC 200A while input-output blocks 210A and 210B are formed at the periphery region 208 of the IC. As such, longer power lines are needed to connect input-output elements 210A and 210B to the bumps 232A, 235A, 232B and 235B at core logic region 215. Input-output circuitry placed at the periphery region of IC 200A (e.g., input-output blocks 210A and 210B) may experience higher voltage drop compared to other circuitry (not shown) that may be formed closer to the center region 215.

Generally, power lines 222A, 225A, 222B, and 225B and power straps 240 are arranged in a mesh pattern. As shown in FIG. 2A, power lines 222A, 225A, 222B and 225B extend from input-output blocks 210A and 210B to their respective bumps 232A, 235A, 232B and 235B, while power straps 240 are arranged orthogonally over power lines 222A, 225A, 222B and 225B. Some of the power straps 240 may also extend across bumps 232A, 235A, 232B and 235B in core region 215 of IC 200A. Power straps 240 may be coupled to the respective power lines 222A, 225A, 222b, and 225B. Connection points between power straps 240 and power lines 222A and 222B, which receive power supply VCCL, are represented with an "X" whereas connection points between power straps 240 and power lines 225A and 225B, which receive ground voltage VSS, are represented with a "+" sign. The respective signs in FIG. 2A represent the connection points on different metal layers or power straps 240 that connect to the respective power lines 222A, 225A, 222B, and 225B.

Such an arrangement forms a shared power network across input-output blocks and IC 200A (as power straps 240 are connected to both input-output blocks 210A and 210B, and power straps 240 also extend over the bumps in core region 215). Having a shared power network may cause uneven current distribution in the bumps due to higher voltage drop from some circuitry in core region 215 to periphery region 208. It should be noted that voltage drop may subsequently lead to degradation of the device operating frequency (commonly referred to as fmax).

Figure 2B:
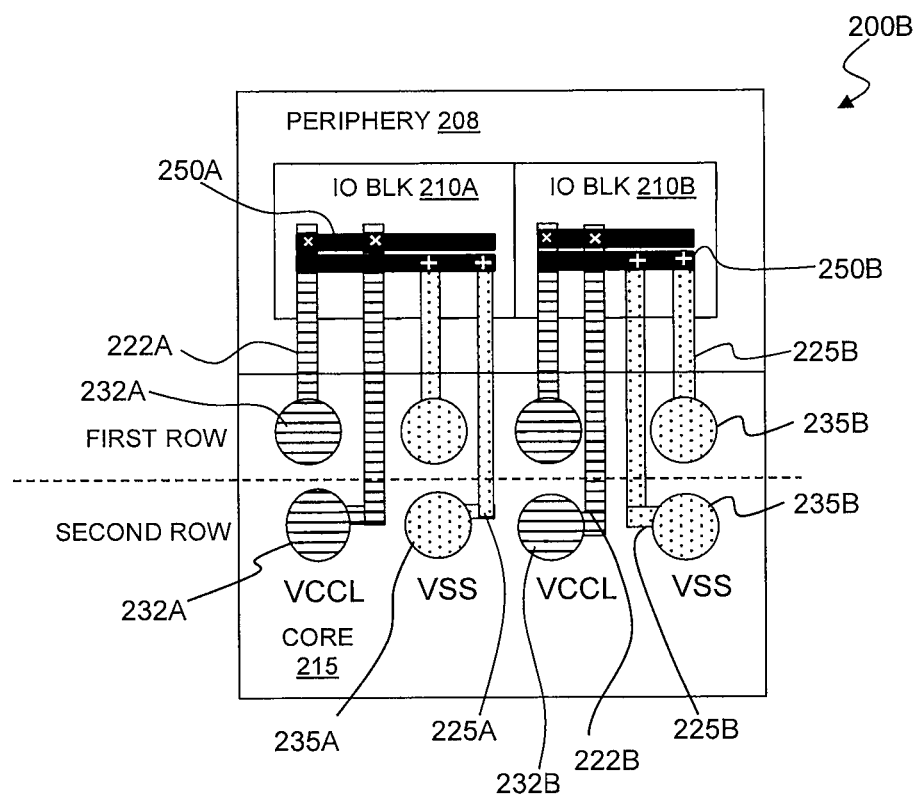
FIG. 2B shows illustrative power lines that connect input-output circuit blocks in an integrated circuit to bumps on the integrated circuit in accordance with embodiments of the present invention.

In one embodiment, power straps such as power straps 240 that extend across the bumps and power lines connecting different circuit blocks to their respective bumps may be removed to eliminate and reduce the uneven current distribution in the bumps. FIG. 2B shows illustrative power lines that connect input-output circuit blocks to bumps on IC 200B in accordance with embodiments of the present invention.

In the embodiment of FIG. 2B, input-output block 210A and input-output block 210B, located in periphery region 208 of IC 200B, are connected to their respective sets of bumps (232A and 235A, and 232B and 235B) that are located in the center region 215 of IC 200B via their respective power lines (e.g., lines 222A,B and 225A,B). The power lines may be metal traces or lines that are formed in a metal layer in the IC. Bumps 232A, 235A, 232B and 235B may be arranged in an array of multiple rows and columns. It should be noted that only two input-output blocks 210A and 210B and two rows of bumps 232A, 235A, 232B and 235B are shown for simplicity even though an IC may include more than two input-output blocks and numerous rows of bumps.

As shown in FIG. 2B, input-output block 210A is connected to bumps 232A via parallel power lines 222A and connected to bumps 235A via parallel power lines 225A. Bumps 232B may supply a voltage level (e.g., VCCL) to input-output block 210B while bumps 235B may supply a ground voltage (e.g., VSS) to input-output block 210B.

It should be noted that the power lines that connect bumps that are located nearest to input-output blocks 210A and 210B (the first row of bumps 232A, 235A, 232B and 235B in FIG. 2B) may be shorter than the power lines that connect bumps that are located farther away from the input-output blocks 210A and 210B (the second row of bumps 232A, 234A, 232B and 235B in FIG. 2B). In one embodiment, even though the power lines are of different lengths, they may have similar path resistance such that current is evenly distributed to the bumps (e.g., bumps 232A, 234A, 232B and 235B in the first and second rows of IC 200B).

In the embodiment of FIG. 2B, local connections or power straps 250A and 250B (shown as solid lines that extend across the respective power lines in each of the input-output blocks 210A and 210B, with an "X" or a "+" sign representing the corresponding connection point on its corresponding metal layer for each of the power lines) may be made within each individual input-output block 210A or 210B. However, as opposed to horizontal straps 240 shown in FIG. 2A, horizontal straps 250A and 250B do not extend across the respective input-output blocks 210A and 210B.

Accordingly, the power lines 222A and 222B are not coupled together, and neither are power lines 225A and 225B. That is, power lines 222A and power lines 225A in input-output block 210A and power lines 222B and 225B in input-output block 210B are physically separate. Such an arrangement may allow two separate power networks or physically isolated power networks to be formed in IC 200B. As an example, the first group of power lines 222A and 225A connecting input-output block 210A to its respective bumps 232A and 235A may form a first power network while the second group of power lines 222B and 225B connecting input-output block 210B to its respective bumps 232B and 235B may form a second power network. As such, input-output blocks 210A and 210B may have their own power network that is physically separate from each other. Having separate power networks may allow input-output blocks 210A and 210B to operate in different power domains.

Additionally, as shown in FIG. 2B, no power straps (either power straps 250A or 250B) are formed in IC 200B that extend across power lines 222A, 225A, 222B, and 225B; and bumps 232A, 235A, 232B, and 235B. In order to obtain comparable path resistances for power lines 222A, 232A, 222B and 232B, additional power straps may be formed on an interposer (not shown in FIG. 2B) that may be placed beneath IC 200B. Such an arrangement, details of which will be described below with reference to FIG. 3, may allow current flow to be confined within each local power network.

Figure 3:
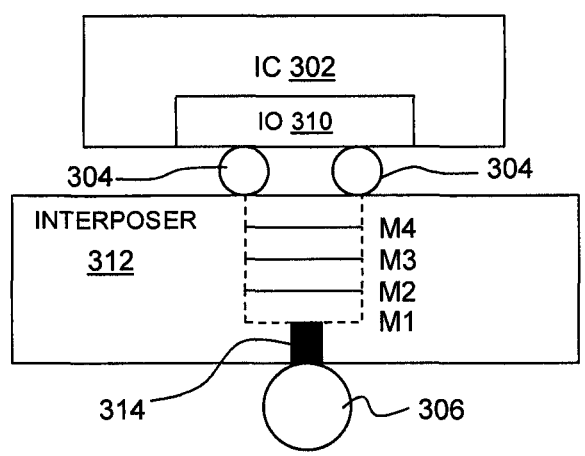
FIG. 3 shows a cross-sectional side view of an illustrative integrated circuit disposed over an interposer in accordance with embodiments of the present invention.

FIG. 3 shows a cross-sectional side view of an illustrative IC disposed over an interposer in accordance with embodiments of the present invention. In FIG. 3, an input-output block 310 is shown in IC die 302. Microbumps 304 connect IC 302 to interposer 312. It should be noted that the structure shown in FIG. 3 is a highly simplified diagram and is not drawn to scale. Interposer 312 may be a multi-layer interposer with metal traces formed in its metal layers. In one embodiment, the metal traces may include power lines (shown as dotted lines in FIG. 3) that are formed in the metal layers of interposer 312 (in FIG. 3, metal layers M1, M2, M3 and M4 are shown). The power lines extend from the interposer to the microbumps 304 on IC die 302. It should be noted that having additional metal traces in an interposer structure may be a more cost-effective solution to mitigate or reduce unwanted voltage drop in the IC and uneven current distribution in the microbumps. The interposer structure (e.g., interposer 312) may accordingly provide additional metal layers needed for the metal traces.

As mentioned above, the power lines may form a part of the power network that connect input-output block 310 to microbumps 304. It should be noted that only one input-output block 310 is shown in FIG. 3 and only a few power lines extending from interposer 312 to microbumps 304 are shown in this example. As mentioned above, instead of forming power lines that extend across the microbumps in the core region of an IC (e.g., microbumps 304 on IC die 302), power lines may be formed in an interposer (e.g., interposer 312). In one instance, the power lines that extend from interposer 312 to microbumps 304 may be parallel to the power lines that extend from input-output block 310 to microbumps 304. In one embodiment, the power lines (not shown) formed within IC die 302 may be structurally similar to those shown in FIG. 2B). In this embodiment, forming power lines within interposer 312 may allow the power lines that connect input-output block 310 to microbumps 304 to have comparable path resistances. In the embodiment of FIG. 3, the power lines formed in the metal layers M1-M4 of interposer 312 may be a part of the power network for input-output block 310.

The metal layers M1-M4 of interposer 312 may be connected to flip chip bump 306 (also referred to as C4 bumps) via through-silicon via (TSV) 314. In one embodiment, interposer 312 may be a passive interposer. In another embodiment, interposer 312 may be an active interposer. In an embodiment where interposer 312 is a passive interposer, decoupling capacitors (or otherwise non-active circuitry) may be included. In an embodiment where interposer 312 is an active interposer (e.g., another silicon die that is disposed beneath IC die 302), active circuitry such as switches and the like may be included in interposer 312. In such instances, the active circuitry within interposer 312 may control the power network coupled to input-output block 310.

Figure 4:
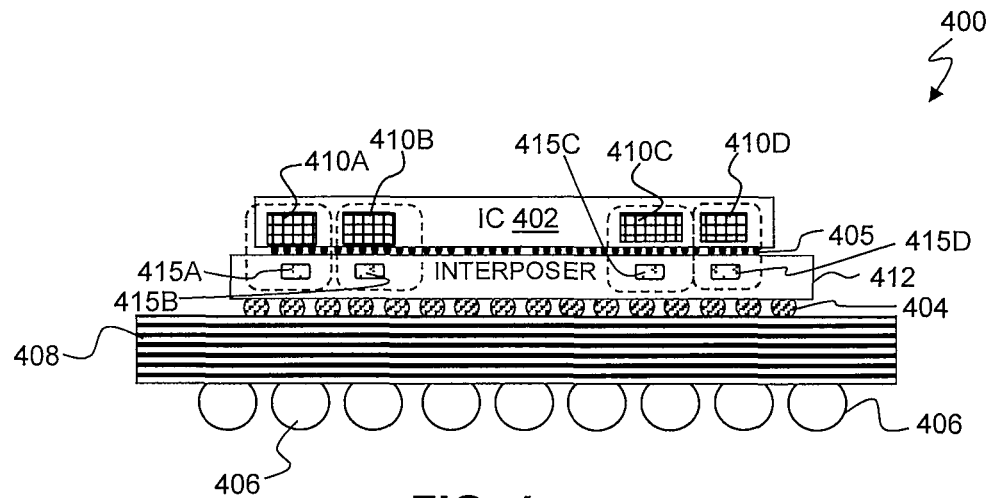
FIG. 4 shows a cross-sectional side view of an illustrative integrated circuit package with an interposer in accordance with embodiments of the present invention.

FIG. 4 shows a cross-sectional side view of an illustrative IC package with an interposer in accordance with embodiments of the present invention. IC package 400 includes IC 402 disposed over interposer 412, which is in turn disposed on package substrate 408. In one embodiment, interposer 412 may be a passive interposer with decoupling capacitors 415A-415D. Microbumps 405 formed on a surface of IC 402 electrically connect IC 402 to interposer 412. Flip chip bumps 404 (also referred to as C4 bumps) electrically connect interposer 412 to a surface of package substrate 408. Solder balls 406 formed on an opposing surface of package substrate 408 in turn connect IC package 400 to external circuitry (e.g., a printed circuit board (PCB)) that are not shown in FIG. 4. Accordingly, signals may be routed between IC 402, interposer 412, package substrate 408, and external elements that may be coupled to IC package 400 (not shown) via the respective interconnects (e.g., microbumps 405, flip chip bumps 404, and solder balls 406).

As described above with reference to FIGS. 2 and 3, a power network may be formed in IC 402 such that a portion of the power network is formed in interposer 412. In the embodiment of FIG. 4, IC 402 may include circuit blocks 410A-410D. As an example, circuit blocks 410A-410D may be input-output blocks that are placed at a periphery region of IC 402. Power lines (not shown in FIG. 4) formed within IC 402 may accordingly couple circuitry within IC 402 (circuit blocks 410A-410D) to microbumps 405. Additional power lines (also not shown) within interposer 412 may be formed beneath each of the circuit blocks 410A-410D and coupled to the respective microbumps 405. These power lines (formed both in IC 402 and interposer 412) may form different power networks. As such, each of the circuit blocks 410A-410D may have its own power network that is separate or physically isolated from each other.

In one embodiment, each of the circuit blocks 410A-410D may have its own decoupling capacitor to localize current flow within each individual power network. The decoupling capacitors may lie directly underneath their respective circuit blocks (e.g., input-output blocks). As shown in FIG. 4, decoupling capacitors 415A-415D are included in interposer 412. As an example, decoupling capacitor 415A, placed beneath circuit block 410A, is coupled to circuit block 410A via associated microbumps on IC 402 to restrict current flow within that power network (in FIG. 4, individual power networks for the respective circuit blocks 410A-410D are highlighted by dotted line boxes).

Figure 5:
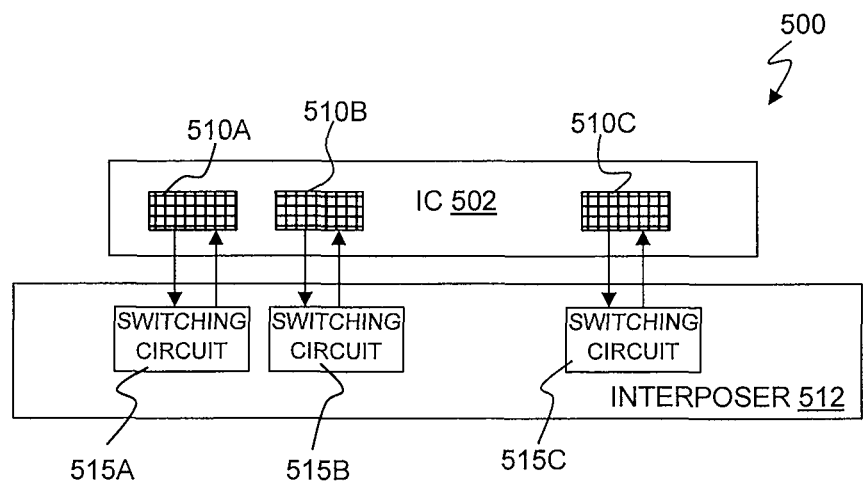
FIG. 5 shows an illustrative integrated circuit disposed over an interposer with embedded switching circuits in accordance with one embodiment of the present invention.

It should be noted that even though decoupling capacitors are shown in FIG. 4, other circuit elements may be embedded in an interposer in this context. As an example, when an active interposer is used, switches may be embedded in the interposer to provide power tuning or power gating to the IC in the package. FIG. 5 shows an illustrative IC 502 disposed over interposer 512 with embedded switching circuits 515A-515C in accordance with one embodiment of the present invention. It should be noted that for the sake of brevity, common elements in an IC package (e.g., microbumps, flip-chip bumps, package substrate, etc.) that have been shown and described above with reference to FIGS. 3 and 4 are not shown in FIG. 5.

As described above with reference to FIGS. 3 and 4, different power networks may be formed in IC 502 such that portions of the respective power networks may be formed in interposer 512. Power lines (not shown in FIG. 5) formed within IC 502 may accordingly couple circuitry within IC 502 (circuit blocks 510A-510C) to microbumps (not shown) that are placed between IC 502 and interposer 512. Additional power lines (also not shown) within interposer 512 may be formed beneath each of the circuit blocks 510A-510C and coupled to their respective microbumps. These power lines (formed both in IC 502 and interposer 512) may form different power networks. As such, each of the circuit blocks 510A-510C may have its own power network that is separate from each other.

In one embodiment, circuit blocks 510A-510C that may be associated with different levels of power consumption. For example, high speed circuit blocks may require higher voltage level while low power blocks may require lower voltage level. In the embodiment of FIG. 5, each of the circuit blocks 510A-510C may be coupled to a switching circuit (e.g., switching circuits 515A-515C, respectively) in interposer 512.

As the circuit blocks 510A-510C may have respective power networks that are separate from each other, switching circuits 515A-515C may provide appropriate power supply signals (e.g., different voltage levels) to circuit blocks 510A-510C via their respective power networks. In some instances, signals (e.g., control signals) may be transmitted between circuit blocks 510A-510C and their respective switching circuits 515A-515C to activate or enable switches in switching circuits 515A-515C such that appropriate power supply signals may be provided to the circuit blocks 510A-510C.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; input-output circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. Circuitry having a core region and a periphery region, comprising:
   first and second groups of input-output blocks formed in the periphery region;
   a first plurality of power lines extending from the core region to the first group of input-output blocks; and
   a second plurality of power lines that is physically and electrically isolated from the first plurality of power lines and that extends from the core region to the second group of input-output blocks, wherein the first plurality of power lines includes a first power line that supplies a first positive voltage level to the first group of input-output blocks, wherein the second plurality of power lines includes a second power line that supplies a second positive voltage level to the second group of input-output blocks, and wherein the first power line is electrically isolated from the second power line.

2. The circuitry defined in claim 1, wherein the first plurality of power lines couples a first set of bumps to the first group of input-output blocks, and wherein the second plurality of power lines couples a second set of bumps that is different than the first set of bumps to the second group of input-output blocks.

3. The circuitry defined in claim 1, further comprising:
   a first set of power straps extending across the first plurality of power lines; and
   a second set of power straps that is different than the first set of power straps extending across the second plurality of power lines.

4. The circuitry defined in claim 2, wherein the circuitry is formed on an integrated circuit and an interposer disposed under the integrated circuit, wherein the first plurality of power lines and the second plurality of power lines are formed in a metal layer in the integrated circuit, and wherein the circuitry further comprises:
   a third plurality of power lines formed in a metal layer in the interposer, wherein the third plurality of power lines is interposed between the first set of bumps and the first group of input-output blocks; and
   a fourth plurality of power lines formed in the metal layer in the interposer, wherein the fourth plurality of power lines is interposed between the second set of bumps and the second group of input-output blocks.

5. The circuitry defined in claim 3, wherein the first set of power straps and the first plurality of power lines form a first power network for the first group of input-output blocks, and wherein the second set of power straps and the second plurality of power lines form a second power network that is separate from the first power network.

6. The circuitry defined in claim 4, further comprising:
   a decoupling capacitor in the interposer that is formed directly underneath the first group of input-output blocks.

7. Circuitry, comprising:
   a first input-output bump;
   a second input-output bump;
   an input-output block formed in an integrated circuit die;
   a first power supply path of a first length that couples the input-output block to the first input-output bump;
   a second power supply path of a second length that couples the input-output block to the second input-output bump, wherein the second length is greater than the first length, and wherein the first and second power supply paths have substantially similar path resistance; and
   a decoupling capacitor formed in an interposer disposed below the integrated circuit die, wherein the decoupling capacitor is formed directly underneath the input-output block and is configured to restrict current flow to the input-output block.

8. The circuitry defined in claim 7, wherein the first and second power supply paths are formed in a metal layer in the integrated circuit die, and wherein the circuitry further comprises:
   a third power supply path formed in the interposer that is coupled to the input-output block via one of the first and second input-output bumps.

9. The circuitry defined in claim 8, wherein the first, second, and third power supply paths form a power supply network for the input-output block.

10. The circuitry defined in claim 8, further comprising:
    an additional input-output block in the integrated circuit die that includes an additional power network for the additional input-output block that is physically isolated from the power network for the input-output block.

11. The circuitry defined in claim 9, wherein the decoupling capacitor comprises a metal-insulator-metal capacitor.

12. Circuitry comprising:
    an integrated circuit having a plurality of input-output blocks; and
    an interposer disposed beneath the integrated circuit, wherein the interposer includes respective power supply lines coupled to each input-output block in the plurality of input-output blocks and a decoupling capacitor coupled to each input-output block of the plurality of input-output blocks, wherein the decoupling capacitor lies directly underneath that input-output block and restricts current flow to that input-output block, wherein first and second input-output blocks in the plurality of input-output blocks respectively include first and second power supply networks, wherein the first power supply network is configured to supply a first positive supply voltage level to the first input-output block, wherein the second power supply network is configured to supply a second positive supply voltage level to the second input-output block, and wherein the first positive supply voltage level is different from the second positive supply voltage level.

13. The circuitry defined in claim 12, wherein the interposer comprises an active interposer that includes at least one switching circuit that enables and disables at least one input-output block of the plurality of input-output blocks.

14. The circuitry defined in claim 12, wherein the integrated circuit comprises additional power supply lines that couple each input-output block of the plurality of input-output blocks to a corresponding set of bumps on the integrated circuit, and wherein the additional power supply lines in the integrated circuit and the respective power supply lines in the interposer form a power supply network for each input-output block of the plurality of input-output blocks.

15. The circuitry defined in claim defined in claim 14, wherein the additional power supply lines in the integrated circuit are of different lengths, and wherein the additional power supply lines have comparable path resistance such that current is distributed evenly to each bump in the corresponding set of bumps.

16. The circuitry defined in claim 14, wherein the additional power supply lines in the integrated circuit and the respective power supply lines in the interposer that form the power supply network for each input-output block of the plurality of input-output blocks are parallel to each other.

\* \* \* \* \*